United States Patent

Basawapatna

[11] Patent Number: 4,554,516
[45] Date of Patent: Nov. 19, 1985

[54] FREQUENCY SOURCE HAVING YIG ABSORPTION/TRANSMISSION FILTER

[75] Inventor: Ganesh R. Basawapatna, Santa Rosa, Calif.

[73] Assignee: Microsource, Inc., Santa Rosa, Calif.

[21] Appl. No.: 676,043

[22] Filed: Nov. 29, 1984

Related U.S. Application Data

[63] Continuation of Ser. No. 371,381, Apr. 23, 1982, abandoned.

[51] Int. Cl.$^4$ .................. H03B 1/00; H03B 1/04; H03B 19/14; H03B 23/00
[52] U.S. Cl. .................... 331/76; 331/77; 331/178; 328/18; 333/176; 333/219
[58] Field of Search .......... 331/60, 76, 77, 117 D, 331/176; 333/175, 176, 219, 235, 221, 218; 328/16, 18

[56] References Cited

U.S. PATENT DOCUMENTS

| | | | |
|---|---|---|---|
| 3,879,677 | 4/1975 | Arnold | 331/77 |
| 4,342,008 | 7/1982 | Jewett | 331/76 X |
| 4,401,952 | 8/1983 | Basawapatna | 330/277 |

Primary Examiner—Eugene R. LaRoche
Assistant Examiner—D. C. Mis
Attorney, Agent, or Firm—Townsend and Townsend

[57] ABSTRACT

An electronically tunable solid-state microwave frequency source comprises a transmission-absorption filter incorporated within a magnetic structure. The transmission-absorption filter is employed with a tunable solid-state oscillator and tunable solid-state multiplier to provide a continuously tunable microwave signal source with enhanced spurious signal attenuation over a multiple-octave tuning range. The filter structure comprises a sphere of monocrystalline garnet such as yttrium iron garnet (YIG) and two coupling loops disposed in the field region of an adjustable field DC magnet. The coupling loops are disposed orthogonal to the magnetic field and to each other. In a specific embodiment the first coupling loop is operative to receive at its input the fundamental frequency signal and at its output is grounded, and the second coupling loop is operative to receive a harmonic input signal at its input and to convey a desired output signal at its output. The magnetic sphere of the transmission-absorption filter typically shares the magnetic field of the YIG sphere used to produce the output of the tuned oscillator. The transmission-absorption filter is incorporated into a source including a switch, a fundamental frequency amplifier and a harmonic frequency amplifier.

7 Claims, 4 Drawing Figures

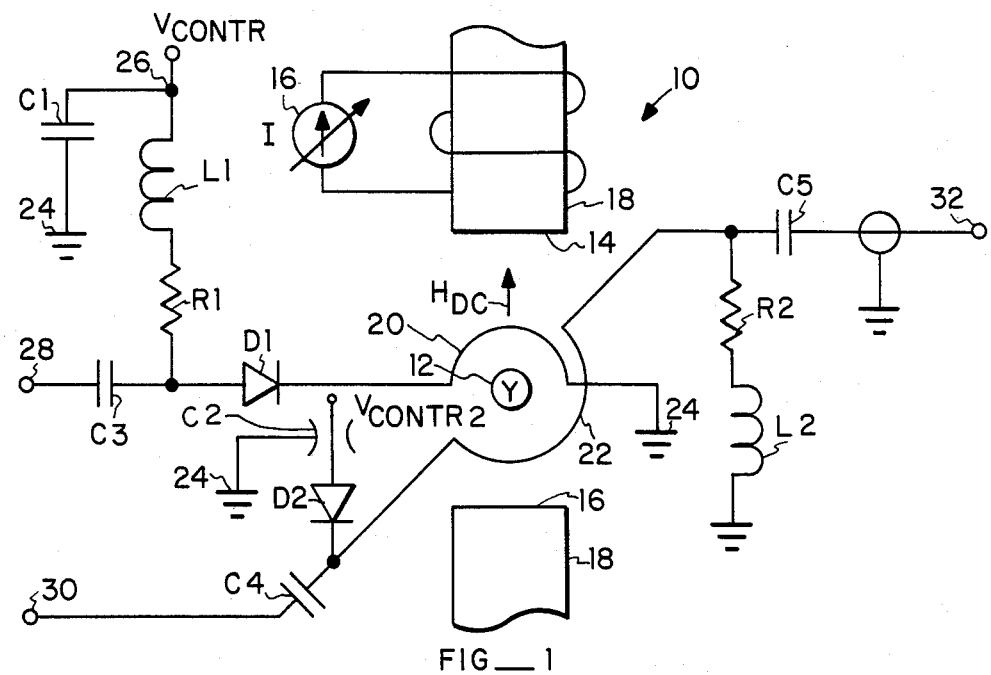
FIG__1
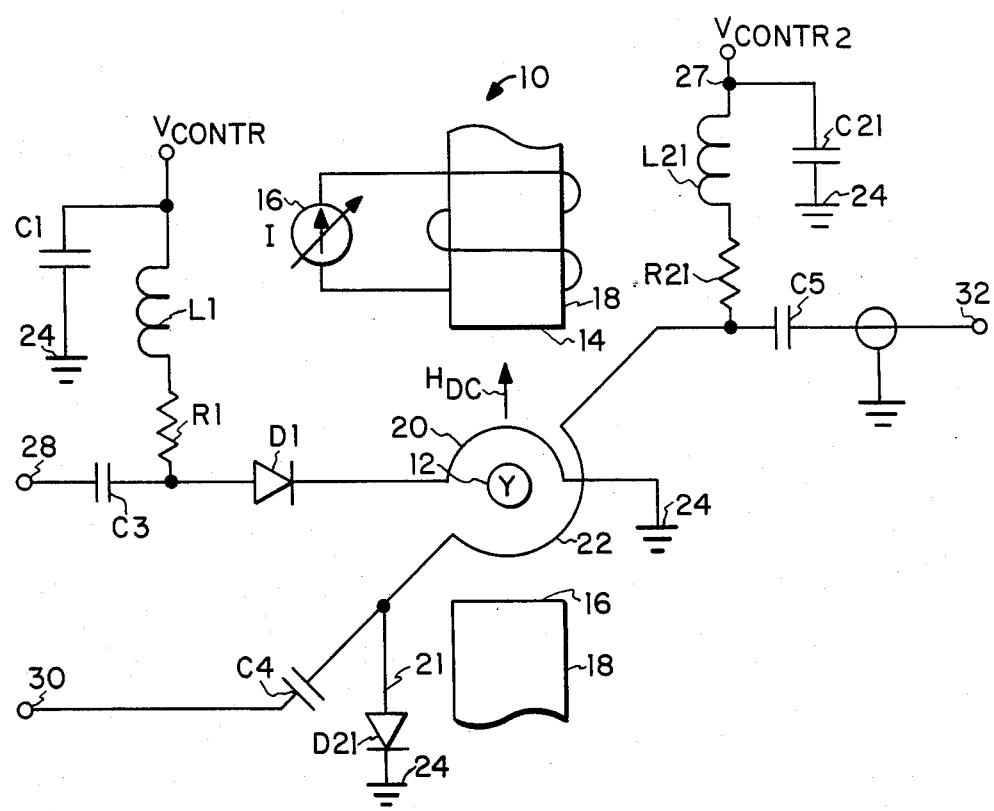
FIG__2

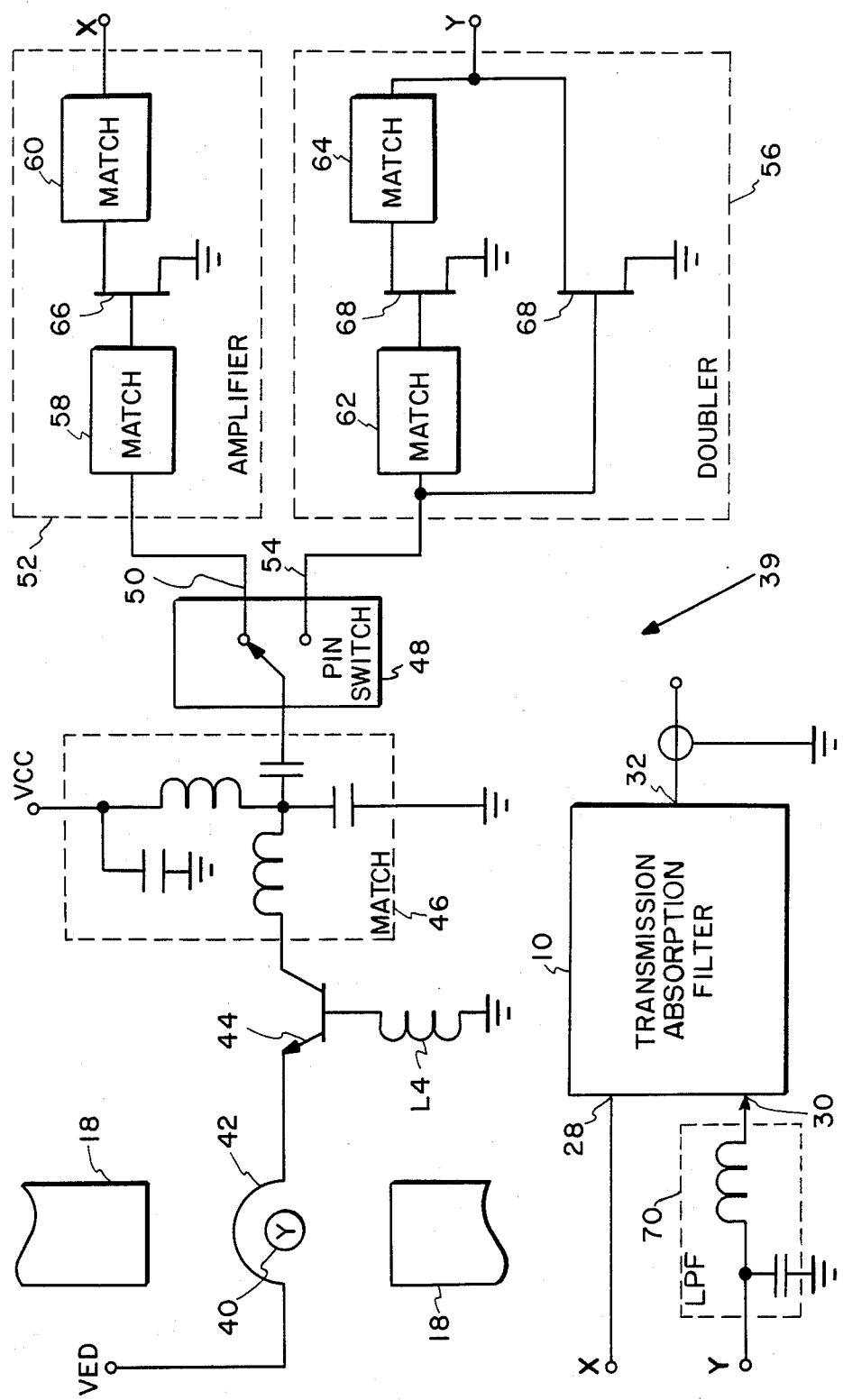
FIG_3

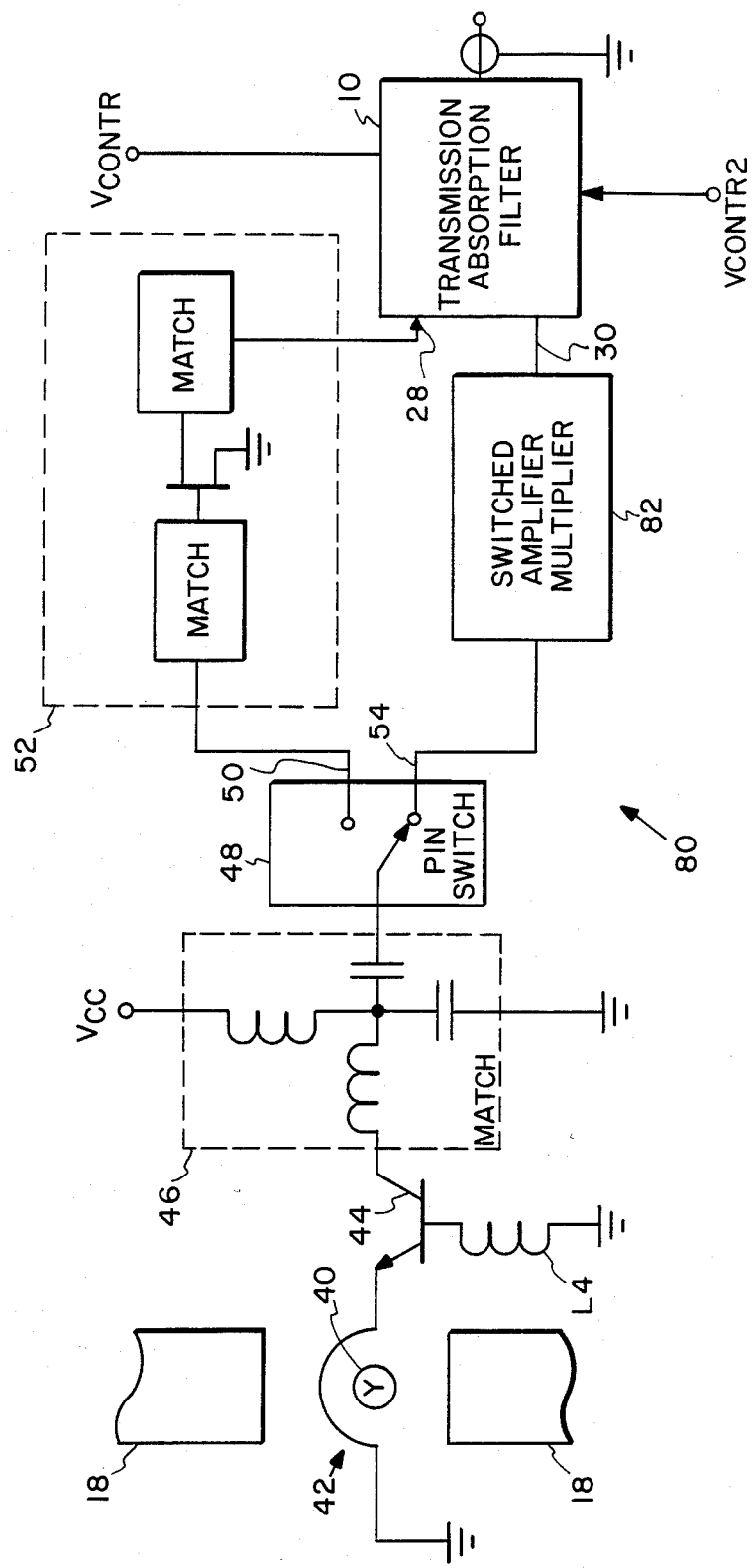
FIG—4

FREQUENCY SOURCE HAVING YIG ABSORPTION/TRANSMISSION FILTER

This is a continuation of application Ser. No. 371,381, filed 04/23/82, now abandoned.

DESCRIPTION

1. Field of Invention

This invention relates to the generation of the microwave signals covering several octaves employing those solidstate microwave devices whose actions depend upon the ferrimagnetic resonance property of monocrystalline garnet materials such as yttrium iron garnet (YIG). Specifically, the invention relates to electronically tunable solid-state microwave signal sources using YIG resonators in a single magnetic structure. Signal sources of this nature find application in microwave test equipment, including multiband sweep oscillators, signal generators, signal synthesizers and spectrum analyzers, in military applications such as reconnaissance receivers and other electronic counter measure and warfare equipment. The present invention is generally limited to devices capable of producing electromagnetic output energy in the frequency range of 1 GHz to about 40 GHz.

Microwave devices employing spheres of monocrystalline garnet materials are attractive in many potential applications because of the extremely high selectivity and tunability which occurs at a frequency linearly dependent on the applied magnetic field. The theory, manufacture, and application of YIG spheres to microwave devices is discussed in the literature, for example, in an article by S. P. A. Marriott entitled "Microwave Devices Using Spheres of Monocrystalline Garnet Materials", *The Marconi Review*, first quarter, 1970, p. 79. Microwave signal sources are presently available in microwave test equipment which cover frequency ranges between about 2 GHz and about 26.5 GHz in the form of sweep oscillators, signal generators and frequency synthesizers. Such microwave signal sources are inherently very expensive because of the difficulty in designing a single microwave microcircuit capable of generating signals over a broad frequency range with relatively flat gain and impedance. The normal approach for such instruments is to partition the frequency range over which operation is desired into relatively narrow band segments based on the design frequency range of associated passive matching networks or active device gain regions and then to provide for each frequency range a linear amplifier and matching network which is specific to the segmented frequency range. The output of each device in a particular segmented frequency range is then typically routed through an electromechanical or solid-state switch to a common output terminal.

Another design approach is the use of a single YIG tuned oscillator coupled to a power amplifier and a YIG tuned multiplier which tunably selects the output frequency as a harmonic of the oscillator frequency.

In recent years, the availability of gallium arsenide metal semiconductor field-effect transistors (MESFETs) has made it possible to provide amplification of electrical signals in the microwave region up to about 40 GHz and beyond using only solid-state devices. Moreover, MESFETs can be operated as nonlinear devices producing harmonics if biased to operate in a nonlinear region. Dualgate MESFETs in particular have been shown to exhibit pronounced nonlinearities which can be advantageously employed to provide high efficiency multiplication.

2. Description of the Prior Art

Three techniques are known for generating microwave signals over several octaves. According to the first and most popular method, a plurality of separately tunable YIG oscillators, each covering a single nonoverlapping frequency range are combined to provide an output routed through a single pole multiple throw electromechanical or solid-state switch. While this technique is conceptually simple, there are many disadvantages. Each YIG oscillator represents substantial expense, size, and weight. Furthermore, present technology is limited in its ability to provide a linear magnetic drive capable of covering a wide range. In addition, the single pole multiple throw switch limits the overall sweep speed of the output signal, particularly of an electromechanical switch is employed. If a solid-state switch, such as a PIN diode is employed, the signal source is subject to relatively high insertion loss and poor inter-channel isolation.

The second technique used in the past employs a YIG tuned oscillator coupled and synchronously tuned to a YIG tuned multiplier. The multiplier generates an output signal by harmonically multiplying the input signal supplied by the YIG tuned oscillator. While this technique requires only one channel and no switches, it has some significant disadvantages. The primary disadvantage is the requirement of accurate synchronous tuning, since the YIG resonators used in both the YIG tuned oscillator and YIG tuned multiplier have very narrow bandwidths. The synchronous tuning of the oscillator and multiplier results in undesirable switching delay and eddy current generation in the magnet. These effects are caused by the necessary step change in the output frequency of the YIG tuned oscillator at band switching points which do not correspond with the end points in the tuning range of the YIG tuned multiplier. Circuitry is necessary to tune out the eddy current effects and to minimize the effect of delay between the two circuits. Such circuitry is complicated, and the undesirable effects are virtually impossible to eliminate.

Another serious disadvantage of the oscillatormultiplier technique is the output of spurious harmonically related signals. The YIG tuned multiplier generally employs a nonlinear element for harmonic generation, such as a step recovery diode. The nonlinear element generates all harmonic frequencies. Hence, the purity of the output signal is only as good as the filtering network following the YIG tuned multiplier.

A third known technique for generating wide tuning range microwave signals is the use of a single oscillator capable of tuning over the entire desired frequency range. Such wideband frequency oscillators are extremely difficult to realize due to device limitations in the circuitry. Such oscillators generally use gallium arsenide (GaAs) MESFETs with maximum operable frequencies of over 40 GHz. However, the gate to source capacitance is so low in MESFETs that the Q or selectivity of the feedback circuit is so high that small signal negative impedance is very difficult to achieve over a wide frequency range. Still further, the multioctave nature of the circuits renders it practically impossible to achieve sufficient harmonic suppression of spurious signals. What is needed is a multi-octave microwave signal source which is capable of tuning over its total bandwidth while maintaining signal purity.

SUMMARY OF THE INVENTION

According to the invention, a solid-state microwave frequency source comprises a transmission-absorption filter employed in connection with an extremely wide tuning range YIG tuned oscillator and a YIG tuned multiplier. The oscillator, multiplier and filters are preferably incorporated within a common magnetic structure. The apparatus is capable of generating a substantially pure signal over several octaves of the tuning range of the oscillator. Specifically, the filter structure comprises a YIG sphere and two coupling loops in the field region of an adjustable field DC magnet with the coupling loops disposed orthogonal to the field and to each other. The first coupling loop consists of an input port and an output port, the input port being coupled to receive the output of the oscillator and the output port being coupled to ground. The second coupling loop comprises an input port and an output port with the input port coupled to receive the output of the multiplier and with the output coupled to an appropriate matching network or the like of a device output terminal. The tuning range of the oscillator is sufficient to cover the tuning range of the multiplier at its highest operating frequency, thus permitting the oscillator and multiplier to switch synchronously between bands over the entire operating range of the device.

The invention will be better understood upon reference to the following detailed description taken in connection with the accompanying drawings.

BRIEF DESCRIPTION OF THE DRAWINGS

FIG. 1 is a schematic diagram of one embodiment of a transmission-absorption filter according to the invention.

FIG. 2 is a schematic diagram of a second embodiment of a transmission-absorption filter according to the invention.

FIG. 3 is a schematic and partial block diagram of a multiband microwave signal source employing a frequency doubler in accordance with the invention.

FIG. 4 is a microwave frequency source incorporating a switched amplifier-multiplier in accordance with the invention.

DETAILED DESCRIPTION OF SPECIFIC EMBODIMENTS

Referring to FIG. 1 there is shown a schematic diagram of a first embodiment of a transmission-absorption filter 10 according to the invention. The filter 10 comprises a YIG resonating sphere 12 of appropriate parameters such as diameter and saturation magnetization, disposed adjacent the opposing faces 14, 16 of a DC electromagnet 18 whose DC magnetic field $H_{DC}$ is controlled by a variable current source 16.

According to the invention, a first coupling loop 20 and a second coupling loop 22 are disposed orthogonally to one another and to the applied DC magnetic field $H_{DC}$ around the YIG sphere 12. The first coupling loop 20, called the fundamental coupling loop because it is intended to carry the fundamental input signal, is coupled to ground 24 at its output end and to the cathode of PIN diode D1 at its input end. The anode of the PIN diode D1 is coupled to switching control voltage $V_{CONTR}$ through a first transistor R1 and first inductor L1. A decoupling capacitor C1 is coupled between ground 24 and the applied voltage terminal node 26 of inductor L1. The fundamental input microwave signal is provided through first input port 28 through a DC blocking capacitor C3 to the anode of PIN diode D1.

The PIN diode D1 is of the type having a minimum of insertion loss when the diode is forward biased and a minimum capacitance when the diode is reverse biased such that the diode may be an effective signal interrupter when reverse biased.

The circuit from the first input port 28 to the first coupling loop 20 is typically constructed in thin film hybrid microwave integrated circuit format, generally known as a microstrip, on a dielectric substrate such as a alumina or sapphire. The microwave signal path is through the first input port 28 to ground 24 on the first coupling loop 20. The DC voltage control circuit is from the voltage control input $V_{CONTR}$ at node 26 through diode D1 to the ground 24.

The harmonic generating circuit comprises second coupling loop 22 having a microwave signal input at second input port 30 and a microwave signal output at output port 32. The microwave signal is coupled through input capacitor C4 and output capacitor C5 adjacent the second input port 30 and output 32, respectively.

There are two embodiments of the DC bias circuitry of the harmonic coupling loop 22. In the first embodiment (FIG. 1), the harmonic coupling loop 22 is DC coupled on the output side through an inductor L2 and a resistor R2 to ground. On the input side, the coupling loop 22 is DC coupled to the cathode of a diode D2 whose anode is coupled to a bypass capacitor C2 to AC ground and to a second DC control voltage $V_{CONTR2}$.

In the second embodiment (FIG. 2), the harmonic coupling loop 22 is DC coupled on the input side to ground 24 through the anode terminal 21 of a diode D21. On the output side, the harmonic coupling loop 22 is DC coupled through resistor R21 and inductor L21 to the control voltage $V_{CONTR2}$. A bypass capacitor C21 is provided between the ground and node 27 at the control voltage $V_{CONTR2}$.

The diodes D2, D21 are preferably PIN diodes having maximum impedance when reverse biased with an effective capacitance of less than about 0.02 pF. Parasitic effects are minimized by use of chip-type diodes enabling construction of the device in microstrip form.

The circuits of FIGS. 1 or 2 operate as follows: In the event a fundamental output signal is desired, diodes D1 and D21 (FIG. 1) or diodes D1 and D21 (FIG. 2) are forward biased by appropriate application of a forward DC bias voltage at the control voltage terminals $V_{CONTR}$ and $V_{CONTR2}$. A positive voltage of five volts is typical. A microwave signal containing the fundamental frequency is applied at the fundamental input port 28, and the magnet 18 is tuned to resonate the YIG sphere 12 at the desired fundamental frequency. With diode D2 (or D21) forward biased, the filter 10 becomes a transmission type filter capable of passing microwave frequencies resonant with the signal applied at the input port 28 to the output port 32 through the resonating circuit including the resonate YIG sphere 12. Out-of-band rejection of signals is on the order of 30 dB. Hence, harmonics normally at 30 dB below the fundamental frequency are suppressed at 60 dB below at the output port 32. In addition, forward bias of the diode D2 (or D21) presents an AC short circuit to ground through bypass capacitor C2 of any microwave harmonic signal applied at second input port 30.

In the event a harmonic signal output is desired, diodes D1 and D2 (FIG. 1) or diodes D1 and D21 (FIG.

2) are reverse biased by appropriate application of a control voltage at control voltage terminals $V_{CONTR}$ and $V_{CONTR2}$. The magnet 18 is tuned to resonate the YIG sphere 12 at the fundamental frequency corresponding to the output harmonic desired. In this case, a signal including the desired harmonic is applied at the harmonic input port 30. The microwave input signal is applied to the harmonic coupling loop 22 which forms an absorption filter in connection with the resonating YIG sphere 12 and fundamental coupling loop 20 under the established bias conditions. The absorption filter mode suppresses the fundamental frequency while passing the harmonic frequency to the output port 32. Hence, according to the invention, a single YIG structure is functional as both a tunable transmission filter and as a tunable absorption filter. This novel combination makes possible several types of microwave signal sources, as hereinafter explained.

FIG. 3 illustrates a first embodiment of a microwave source amplifier-doubler 39 incorporating a filter 10 according to the invention. In the embodiment of FIG. 3, a separate YIG sphere 40 is employed for microwave excitation. A coupling loop 42 couples the bias voltage $V_{ED}$ to the emitter of a bipolar transistor 44 (or to the source of a suitable equivalent function MESFET). A feedback inductor L4 couples the base of the transistor 44 to ground. The collector of the transistor 44 is coupled to an LC matching network 46, the output of which is coupled to PIN routing switch 48 having one input and a choice of two outputs.

The YIG sphere 40 in the coupling loop is selected to oscillate over a range of fundamental frequencies, and the transistor 44 and coupling network 46 are selected to provide optimal oscillation and matching over the range of operation of the fundamental frequencies of interest.

Referring to the PIN switch 48, one output terminal 50 is coupled to a linear amplifier 52 which may be of the unbalanced or balanced type, and the other output 54 is coupled to a doubling amplifier 56, which may also be of the unbalanced or balanced type. Both amplifiers 52, 56 include matching networks 58, 60, 62, and 64 and an appropriate high-frequency amplifying element such as a MESFET 66, 68. The output of the doubler 56 is coupled to a low-pass filter 70, which may be a single pole LC circuit which is tuned to attenuate all harmonics above the second harmonic. The output of the fundamental amplifier 52 is coupled to the fundamental input port 28 of the filter 10 (FIG. 1 or FIG. 2). The output of the low-pass filter 70 is coupled to the harmonic frequency input port 30 of the filter 10.

In a preferred embodiment, the oscillating YIG sphere 40 shares the same tuned magnetic field as the YIG sphere 12 within the magnet 18 of the filter 10 (FIG. 1). By proper matching of the YIG structures, synchronous tuning of the apparatus of FIG. 3 is achievable. In addition, the operating mode of the PIN switch 48 is jointly controlled with the operating mode of the filter 10 as determined by the control voltages used to bias the fundamental frequency path and the harmonic frequency path. The switched amplifier-doubler 39 of FIG. 3 can be constructed primarily in microstrip form. This structure represents a significant advance in terms of cost and versatility of a microwave frequency source.

The source amplifier-doubler 39 according to the invention preferably includes a balanced doubler circuit 56, as illustrated in FIG. 3. A balanced doubler has the advantage of internal harmonic cancellation characteristics which allow the circuit to reject certain undesired harmonics. Hence, appropriate control of the continuously variable magnet current and the switchable control voltages permits the substantially continuous tuning of the apparatus of FIG. 3 from the lowest fundamental frequency to twice the highest fundamental frequency with good linearity, harmonic control and sweep speed.

Turning to FIG. 4, there is shown a multiple-octave microwave source 80 which incorporates a switched amplifier-multiplier 82. The structure is similar to the amplifier-doubler of FIG. 3 with the doubler replaced by a switched amplifier-multiplier (SAM) 82. A suitable switched amplifier-multiplier is described in a patent application by the present inventor filed July 17, 1981 under Ser. No. 285,211 now U.S. Pat. No. 4,401,952. The output of the SAM 82 is directly coupled to the harmonic input port 30 of the transmission absorption filter 10. The band of multiplication of the SAM 82 is controlled by appropriate DC control voltages in an absorption filter mode, the fundamental frequency is suppressed while passing the harmonic frequency in the manner previously described in connection with FIGS. 1, 2 and 3.

Two possible embodiments of the source 80 according to the invention are apparent. First all microwave signal conduits may be constructed in microwave integrated circuit form within a YIG structure. However, a separate switched amplifier-multiplier 82 may be provided as an add-on device whereby the harmonic output 54 of the PIN switch 48 and the harmonic input port 30 of the transmission absorption filter 10 are made available as external ports to which the input and output of the switched amplifier-multiplier 82 may be coupled.

The invention has now been described with reference to specific embodiments. Other embodiments will be apparent to those of ordinary skill in the art upon reference to this disclosure. It is therefore not intended that this invention be limited except as indicated by the appended claims.

I claim:

1. For use in microwave signal generation, a transmission/absorption filter comprising:
    a sphere of monocrystalline garnet;
    a turnable DC magnet for producing a controlled magnetic field about said sphere thereby to form a magnetic field structure;
    a first coupling loop disposed transverse of the magnetic field about said sphere;
    a second coupling loop disposed transverse of said magnetic field about said sphere and orthogonal to said first coupling loop;
    said first coupling loop having a first output coupled to a DC ground and a first input coupled to receive a first microwave signal at a first input port;
    said second coupling loop having a second output coupled to an output port and a second input coupled to receive a second microwave signal at a second input port;
    first means for blocking and unblocking said first microwave signal applied to said first coupling loop; and
    second means for blocking and unblocking said second microwave signal applied to said second coupling loop; wherein
    said sphere is operative to resonate under control of said DC magnet to either pass a selected fundamental frequency or alternately to reject said fundamental frequency for providing alternatively transmission filtering and absorption filtering of harmonically related microwave signals applied to said first coupling loop and said second coupling loop to convey a selected microwave signal respectively to said output port.

2. The apparatus according to claim 1 wherein said first blocking and unblocking means comprises a first PIN diode connected in series with the input of said first coupling loop and DC voltage biasing means coupled to one terminal of said first diode, the other terminal of which being DC coupled to a fixed DC voltage level such as ground.

3. The apparatus according to claim 2 wherein said second blocking and unblocking means comprises a second PIN diode coupled in shunt to the input of said second coupling loop and having a DC signal path through said second coupling loop; and DC voltage bias means coupled to one terminal of said second diode, the other terminal of which being DC coupled to a voltage reference such as ground.

4. A microwave source comprising:
a continuously tunable microwave oscillator, including a first monocrystalline garnet sphere, coupled to a microwave signal amplifier for generating a fundamental frequency signal;
a fundamental frequency amplifier operative to amplify said fundamental frequency signal;
a harmonic frequency amplifier operative to amplify a signal which is harmonic to said fundamental frequency signal;
said microwave signal amplifier being coupled to a dual path switching means, said dual path switching means being coupled through a first output terminal to said fundamental frequency amplifier and through a second output terminal to said harmonic frequency amplifier; and
a transmission/absorption filter having a fundamental frequency input and a harmonic frequency input, the fundamental frequency input being coupled to an output of said fundamental frequency amplifier and said harmonic frequency input being coupled to an output of said harmonic frequency amplifier, said transmission/absorption filter including a second monocrystalline garnet sphere which is continuously tunable to resonate over a range of selected microwave frequencies, a first coupling loop coupled to receive an input signal at said fundamental frequency input, and a second coupling loop coupled to receive an input signal at said harmonic frequency input to convey an output microwave signal at a system output port.

5. The apparatus according to claim 4 further including a controlled magnetic field source, said controlled magnetic field source being common to said first monocrystalline garnet sphere and to said second monocrystalline garnet sphere to assure synchronous tuning.

6. The apparatus according to claim 4 or 5 wherein said harmonic frequency amplifier comprises a frequency doubler coupled to a low-pass filter tuned to attenuate frequencies above the second harmonic frequency.

7. A method for controlling output frequencies in a microwave sweep amplifier comprising the steps of:
applying a first fundamental frequency to a first coupling loop around a monocrystalline garnet sphere in a magnetic field tuned to resonate said sphere at said first fundamental frequency thereby inducing the same frequency in a second coupling loop about said sphere, said second coupling loop being coupled to a system signal output terminal; and alternatively
applying a signal containing a second frequency, said second frequency being a harmonic of said first fundamental frequency to said second coupling loop while blocking signals applied to the input of said first coupling loop by resonating said monocrystalline garnet sphere at said first fundamental frequency of said first coupling loop and causing signals at said fundamental frequency to be absorbed thereby coupling only said harmonic frequency to said output port while attenuating signals of frequencies other than said second frequency.

* * * * *